US007067939B2

(12) United States Patent
Hartmann et al.

(10) Patent No.: US 7,067,939 B2
(45) Date of Patent: Jun. 27, 2006

(54) HIGH-VOLTAGE PULSE GENERATOR FOR AN ELECTROSTATIC FILTER

(75) Inventors: Werner Hartmann, Grossenseebach (DE); Michael Römheld, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 509 days.

(21) Appl. No.: 10/245,296

(22) Filed: Sep. 18, 2002

(65) Prior Publication Data

US 2003/0071521 A1 Apr. 17, 2003

(30) Foreign Application Priority Data

Sep. 18, 2001 (DE) ................................ 101 45 993

(51) Int. Cl.
*H03K 3/00* (2006.01)
*H03K 3/64* (2006.01)
*H02H 7/00* (2006.01)

(52) U.S. Cl. ....................................... 307/108; 361/231

(58) Field of Classification Search ................ 307/107, 307/108; 361/231

See application file for complete search history.

(56) References Cited

U.S. PATENT DOCUMENTS 4,600,411 A * 7/1986 Santamaria .................... 96/82
5,274,271 A * 12/1993 McEwan .................... 307/108
6,323,600 B1 * 11/2001 Statnic et al. ........... 315/209 R
6,667,875 B1 * 12/2003 Hartmann ................... 361/235

FOREIGN PATENT DOCUMENTS

| | | | |
|---|---|---|---|
| DE | 19707504 A1 | | 2/1997 |
| DE | 19946786 A1 | | 9/1999 |
| DE | 199 46 786 | | 3/2000 |
| DE | 19946786 A1 | * | 3/2000 |
| EP | 1119912 A0 | | 4/2000 |
| JP | 60002080 A | | 1/1985 |
| WO | WO 97/17138 A | | 5/1997 |

OTHER PUBLICATIONS

European Search Report dated Feb. 9, 2006.
Von Peter Wetzel, "Thyristorschutz mit halbleitern — wirtschaftlich und sicher," 1977, pp. 152-158.

* cited by examiner

*Primary Examiner*—Brian Sircus
*Assistant Examiner*—Hal I. Kaplan
(74) *Attorney, Agent, or Firm*—Harness, Dickey & Pierce, P.L.C.

(57) ABSTRACT

A high-voltage pulse generator includes a storage capacitor which is connected to a voltage source via leads. One of the leads is connected to a reference potential via a node point. A switching device is connected in parallel with the storage capacitor on the voltage source side. An output inductance is connected to the one lead via a further node point arranged between the storage capacitor and the first node point. A diode lies between the node points.

18 Claims, 1 Drawing Sheet

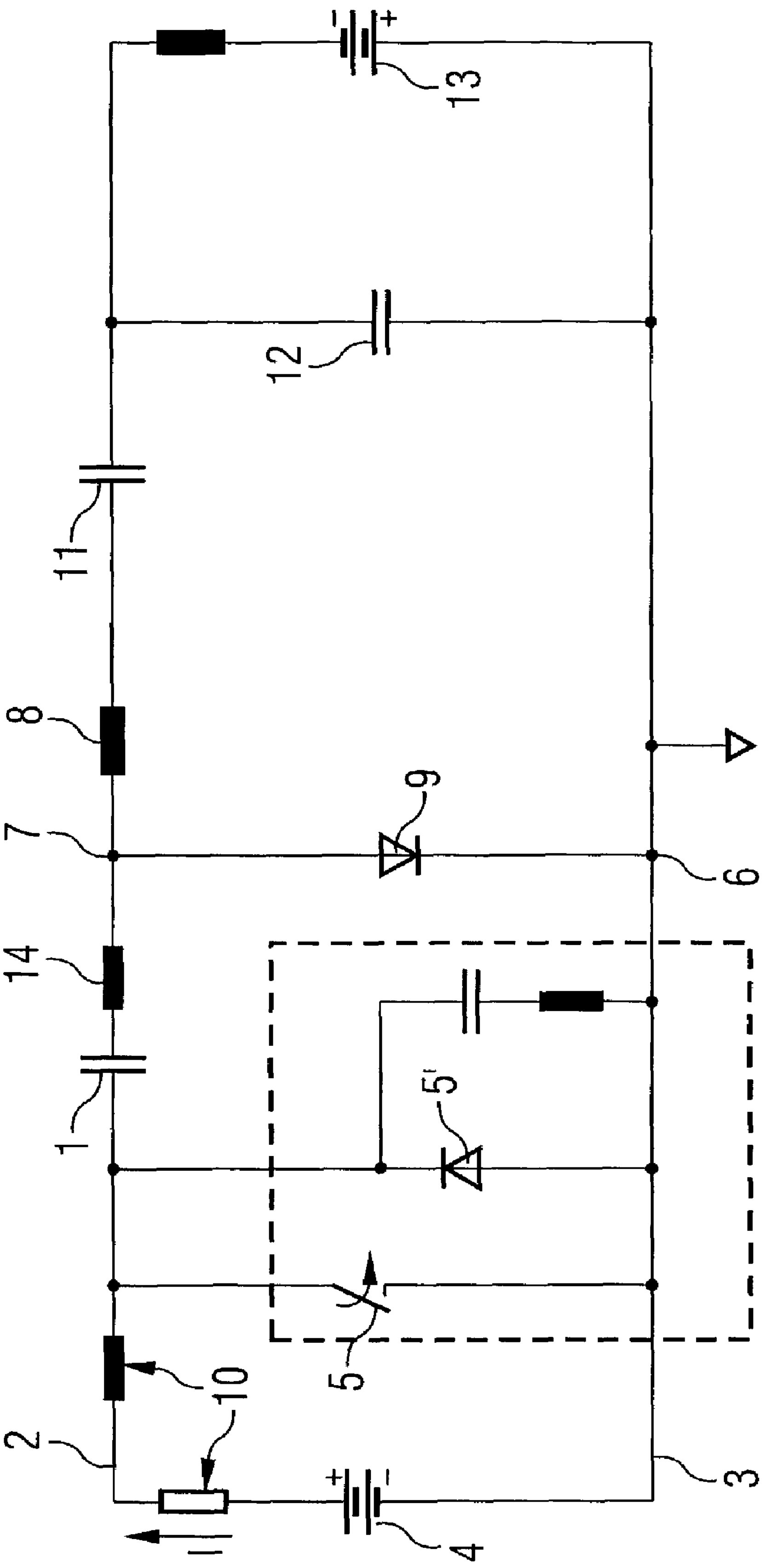
13
12
11
8
7
9
6
14
5'
1
5
2
10
3
4
I

HIGH-VOLTAGE PULSE GENERATOR FOR AN ELECTROSTATIC FILTER

The present application hereby claims priority under 35 U.S.C. §119 on German patent publication number 10145993.9 filed Sep. 18, 2001, the entire contents of which are hereby incorporated herein by reference.

FIELD OF THE INVENTION

The present invention generally relates to a high-voltage pulse generator for an electrostatic filter. Preferably, it relates to one, with a storage capacitor, which is connected to a high-voltage source via a first and a second lead, the second lead being connected to a reference potential via a first node point, with a switching device, which is connected in parallel with the storage capacitor on the high-voltage source side, and with an output inductance, which is connected to the second lead via a second node point, the second node point being arranged between the storage capacitor and the first node point and it being possible to output a high-voltage pulse via the output inductance.

BACKGROUND OF THE INVENTION

High-voltage pulse generators are commonly known. For example, they are used in electrostatic dust separators (electrostatic filters) to superimpose voltage pulses on a DC voltage to increase the separation performance.

A similar high-voltage pulse generator is also disclosed by DE 199 46 786 A1. With this, an inductance is arranged between the node points. However, it does not have an output inductance.

High-voltage pulse generators are often highly stressed due to flashovers in the electrostatic filter (filter breakdowns). For, as a result of the filter breakdowns, high voltage and/or current levels are coupled into the pulse generator. The coupling can be so strong that it leads to the destruction of components of the pulse generator, in particular of the switching device. Under certain circumstances, such a filter breakdown can also result in an increase in the voltage present on the storage capacitor by several tens of kilovolts, which can lead to a destruction of the storage capacitor.

If such a filter breakdown occurs while the switching device is closed, a high short circuit current can even flow through the switching device. As a result of this, the switching device can be irreversibly damaged. Also, in such a case, the life of the storage capacitor is considerably reduced.

To prevent damage of this kind, in the prior art, protective circuits, e.g. with varistors, are provided. Furthermore, the individual elements of the pulse generator are dimensioned accordingly so that they also withstand filter breakdowns of this kind. As a consequence, prior art pulse generators are expensive.

SUMMARY OF THE INVENTION

An object of an embodiment of the present invention includes creating a high-voltage pulse generator for an electrostatic filter, which is more cost-effective to produce than known high-voltage pulse generators.

An object may be achieved by, according to one embodiment, arranging a diode between the first and the second node point, which is arranged in the forward direction with respect to a charging current flowing from the high-voltage source into the storage capacitor.

As a result of this, in the case of a filter breakdown, a short circuit path of low impedance is provided so that a short circuit current is prevented from reaching the remaining elements of the high-voltage pulse generator. At the same time, a voltage acting on the remaining components of the high-voltage pulse generator is limited to the forward voltage of the diode. At the same time, a short circuit current flowing through the diode is limited by the output inductance.

If a re-charging current limiting element is arranged between the storage capacitor and the second node point, currents are prevented from reaching the remaining components of the high-voltage pulse generator in a particularly reliable manner. The re-charging current limiting element is preferably designed as an inductance.

BRIEF DESCRIPTION OF THE DRAWINGS

Further advantages and details can be seen from the following description of an exemplary embodiment in conjunction with the drawings and the claims, wherein FIG. 1 shows a high-voltage pulse generator with a downstream electrostatic filter.

DETAILED DESCRIPTION OF THE PREFERRED EMBODIMENTS

According to FIG. 1, a high-voltage pulse generator has a storage capacitor 1, which is connected to a high-voltage source 4 via a first and a second lead 2, 3. A switching device 5 with a freewheel diode device 5' is connected in parallel with the storage capacitor 1 on the high-voltage source side.

Details of the switching device 5 are of minor importance within the framework of an embodiment of the present invention. With regard to the details of such a switching device 5, reference is made to DE 199 46 786 A1, for example.

The second lead 3 has two node points 6, 7. The second lead 3 is connected to a reference potential via the first node point 6. An output inductance 8 is connected to the second node point 7. A diode 9 is arranged between the node points 6, 7.

A charging current limiting element 10 is arranged in the first lead 2 between the high-voltage source 4 and the switching device 5. According to FIG. 1, the charging current limiting element 10 is designed as a combination (here, a series circuit) of a resistor and an inductance. The charging current limiting element 10 could, however, also be designed as a pure resistor or as a pure inductance.

A high-voltage pulse can be output from the high-voltage pulse generator via the output inductance 8 and a decoupling capacitor 11 connected downstream of this to an electrostatic filter 12, which is only shown schematically. At the same time, the electrostatic filter 12 is pre-charged via its own high-voltage source 13 with a DC voltage in the range of several tens of kilovolts. The DC voltage level of the electrostatic filter 12 is decoupled from the high-voltage pulse generator by means of the decoupling capacitor 11.

If the switching device 5 is open, the storage capacitor 1 is charged with a charging current I via the leads 2, 3. For this purpose, the diode 9 is polarized in the forward direction. If the switching device 5 is closed, the storage capacitor 1 is discharged, as a result of which the voltage appearing at the electrostatic filter 12 is increased.

With regard to the discharging of the storage capacitor 1, the diode 9 is polarized in the reverse direction. The storage capacitor 1 therefore discharges exclusively via the inductance 14 and the output inductance 8. The inductance 14 serves as a re-charging current limiting element 14 and is arranged between the storage capacitor 1 and the second node point 7.

After the charging of the electrostatic filter 12, part of the charge flows back via the output inductance 8. However, the current then flows not via the re-charging current limiting element 14, but essentially via the diode 9 and the freewheel diode device 5'. For this purpose too, the diode 9 is polarized in the forward direction.

Also in the case of a filter breakdown, a short circuit current flows essentially merely via the output inductance 8 and the diode 9. Merely a voltage, which corresponds to the forward voltage of the diode 9, is allowed through to the remaining components of the pulse generator. At the same time, the voltage limiting applies independently of whether the switching device 5 is open or closed. A short circuit current, possibly flowing via switching device 5, is therefore also held at a low level by the forward voltage and, moreover, is even further attenuated by the re-charging current limiting element 14.

The high-voltage pulse generator according to the invention is thus designed to be able to withstand high voltages by using merely a high-voltage diode 9 between the two node points 6, 7. As a result of this, the storage capacitor 1 and the switching device 5 can be dimensioned considerably more cost-effectively than with a comparable prior art high-voltage pulse generator. The power loss of the high-voltage pulse generator according to the invention is considerably less than the power loss of a comparable pulse generator in which a resistor or an inductance is arranged between the node points 6, 7. Moreover, with the pulse generator according to the invention, parasitic oscillations with high-voltage amplitudes of more than 10 kV cannot occur, which is the case with pulse generators in which an inductance is arranged between the two node points 6, 7.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A high-voltage pulse generator for an electrostatic filter, comprising:

a storage capacitor, connected to a high-voltage source via a first lead and a second lead, the second lead being connected to a reference potential via a first node point;

a switching device and the storage capacitor being provided on parallel conductive paths with respect to the high-voltage source;

an output inductance, connected to the second lead via a second node point, the second node point being arranged between the storage capacitor and the first node point, wherein a high-voltage pulse can be output via the output inductance; and a diode, arranged between the first node point and the second node point, polarized in the forward direction with respect to a charging current flowing from the high-voltage source into the storage capacitor.

2. The high-voltage pulse generator as claimed in claim 1, further comprising:

a charging current limiting element, arranged in the first lead between the high-voltage source and the switching device.

3. The high-voltage pulse generator as claimed in claim 2, wherein the charging current limiting element is designed as at least one of a resistor, an inductance and a combination of a resistor and an inductance.

4. The high-voltage pulse generator as claimed in claim 1, further comprising:

a re-charging current limiting element, arranged between the storage capacitor and the second node point.

5. The high-voltage pulse generator as claimed in claim 4, wherein the re-charging current limiting element is designed as an inductance.

6. The high-voltage pulse generator as claimed in claim 1, further comprising:

a decoupling capacitor, connected downstream of the output inductance.

7. The high-voltage pulse generator as claimed in claim 2, further comprising:

a re-charging current limiting element, arranged between the storage capacitor and the second node point.

8. The high-voltage pulse generator as claimed in claim 7, wherein the re-charging current limiting element is designed as an inductance.

9. The high-voltage pulse generator as claimed in claim 3, further comprising:

a re-charging current limiting element, arranged between the storage capacitor and the second node point.

10. The high-voltage pulse generator as claimed in claim 9, wherein the re-charging current limiting element is designed as an inductance.

11. The high-voltage pulse generator as claimed in claim 2, further comprising:

a decoupling capacitor, connected downstream of the output inductance.

12. The high-voltage pulse generator as claimed in claim 3, further comprising:

a decoupling capacitor, connected downstream of the output inductance.

13. The high-voltage pulse generator as claimed in claim 4, further comprising:

a decoupling capacitor, connected downstream of the output inductance.

14. The high-voltage pulse generator as claimed in claim 5, further comprising:

a decoupling capacitor, connected downstream of the output inductance.

15. The high-voltage pulse generator as claimed in claim 7, further comprising:

a decoupling capacitor, connected downstream of the output inductance.

16. The high-voltage pulse generator as claimed in claim 8, further comprising:

a decoupling capacitor, connected downstream of the output inductance.

17. The high-voltage pulse generator as claimed in claim 9, further comprising:

a decoupling capacitor, connected downstream of the output inductance.

18. The high-voltage pulse generator as claimed in claim 10, further comprising:

a decoupling capacitor, connected downstream of the output inductance.

* * * * *